(12) United States Patent
Chamberlin et al.

(10) Patent No.: US 10,405,421 B2
(45) Date of Patent: Sep. 3, 2019

(54) SELECTIVE DIELECTRIC RESIN APPLICATION ON CIRCUITIZED CORE LAYERS

(71) Applicant: International Business Machines Corporation, Armonk, NY (US)

(72) Inventors: Bruce J. Chamberlin, Vestal, NY (US); Matthew S. Kelly, Oakville (CA); Scott B. King, Rochester, MN (US); Joseph Kuczynski, North Port, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/845,781

(22) Filed: Dec. 18, 2017

(65) Prior Publication Data

US 2019/0191558 A1    Jun. 20, 2019

(51) Int. Cl.
*H05K 1/03* (2006.01)
*H05K 1/09* (2006.01)
(Continued)

(52) U.S. Cl.
CPC ........ *H05K 1/0366* (2013.01); *H05K 1/0373* (2013.01); *H05K 1/09* (2013.01); *H05K 1/11* (2013.01); *H05K 1/115* (2013.01); *H05K 3/0014* (2013.01); *H05K 3/429* (2013.01); *H05K 3/4664* (2013.01); *H05K 1/0284* (2013.01);
(Continued)

(58) Field of Classification Search
CPC ...... H05K 1/0366; H05K 1/09; H05K 1/0373; H05K 1/115; H05K 3/429; H05K 3/4664; H05K 3/0014; H05K 2203/1453; H05K 2203/0278
See application file for complete search history.

(56) References Cited

U.S. PATENT DOCUMENTS

| 4,880,465 A | 11/1989 | Loria et al. |
| 5,806,177 A * | 9/1998 | Hosomi ............... H05K 3/4655 156/233 |

(Continued)

FOREIGN PATENT DOCUMENTS

| CN | 1140973 A | 1/1997 |
| CN | 1377217 A | 10/2002 |

(Continued)

OTHER PUBLICATIONS

AUS820170103US01, Appendix P; List of IBM Patent or Applications Treated as Related, Jul. 6, 2018, 2 pages.
(Continued)

*Primary Examiner* — Ishwarbhai B Patel
(74) *Attorney, Agent, or Firm* — Nathan M. Rau

(57) ABSTRACT

A layup for multiple-layer printed circuit board manufacturing is formed according to a process that includes selectively applying a dielectric resin to a high resin demand region of a circuitized core layer without applying the dielectric resin to another region of the circuitized core layer. The process also includes partially curing the dielectric resin within the high resin demand region. The process further includes forming a layup that includes a layer of pre-impregnated (prepreg) material adjacent to the partially cured dielectric resin within the high resin demand region of the circuitized core layer.

2 Claims, 16 Drawing Sheets

(51) Int. Cl.
*H05K 1/11* (2006.01)
*H05K 3/00* (2006.01)
*H05K 3/46* (2006.01)
*H05K 3/42* (2006.01)
*H05K 1/02* (2006.01)
*H05K 1/14* (2006.01)

(52) U.S. Cl.
CPC ....... *H05K 1/14* (2013.01); *H05K 2203/0278* (2013.01); *H05K 2203/1453* (2013.01)

(56) References Cited

U.S. PATENT DOCUMENTS

| | | | |
|---|---|---|---|
| 6,931,723 B1* | 8/2005 | Powell | H01L 21/486 29/830 |
| 7,172,925 B2* | 2/2007 | Murakami | H01L 21/4857 174/255 |
| 8,992,200 B2 | 3/2015 | Van Nieuwenhove et al. | |
| 2012/0061880 A1 | 3/2012 | Han | |
| 2012/0329912 A1* | 12/2012 | Liu | C08K 3/38 523/445 |
| 2015/0305150 A1* | 10/2015 | Ohata | C09K 19/38 428/201 |

FOREIGN PATENT DOCUMENTS

| | | |
|---|---|---|
| CN | 1396797 A | 2/2003 |
| CN | 101106861 A | 1/2008 |
| CN | 104428892 A | 3/2015 |
| CN | 105792547 A | 7/2016 |
| JP | 2000151113 A | 5/2000 |
| JP | 2009067867 A | 4/2009 |
| KR | 101061243 B1 | 8/2011 |
| WO | WO-01/84896 A1 | 11/2001 |

OTHER PUBLICATIONS

U.S. Appl. No. 16/029,114, to Bruce J. Chamberlin et al., entitled, *Selective Dielectric Resin Application on Circuitized Core Layers*, assigned to International Business Machines Corporation, 24 pages, filed Jul. 6, 2018.

Olney, *Multilayer PCB—Resin Flow Compensation*, Application Note (AN2011_3), Aug. 29, 2012, 4 pages, In-Circuit Design Pty Ltd (ICD.com, online), URL: www.icd.com.au/webinars/12-08-29-Selecting%20a%20PCB%20Fabricator-5PM.pdf.

International Search Report and Written Opinion for Application PCT/IB2018/059748 dated Apr. 17, 2019, 10 pages.

\* cited by examiner

SELECTIVE DIELECTRIC RESIN APPLICATION ON CIRCUITIZED CORE LAYERS

BACKGROUND

A printed circuit board (PCB) laminate design may include a multiple-layer "stack-up" design that includes multiple layers. For example, a PCB may be formed of a fiberglass cloth pre-impregnated with a thermoset resin, also referred to as a "prepreg" material. Due to the complex nature of fluid flow properties for thermoset resins, design of PCB lamination processes that use thermoset resins can be challenging. The complex nature of some multiple-layer PCB designs may make it particularly difficult to accurately achieve a specific dielectric thickness and total board thickness while also maintaining a satisfactory impedance value. For example, high density interconnect (HDI) boards may incorporate microvias, blind and buried vias, multiple controlled impedance and differential traces, fine line technology, and tighter tolerances.

SUMMARY

According to an embodiment, a process of manufacturing a multiple-layer printed circuit board is disclosed. The process includes selectively applying a dielectric resin to a region of a circuitized core layer. The process also includes partially curing the dielectric resin prior to performing a lamination cycle to form a multiple-layer printed circuit board that includes the circuitized core layer.

According to another embodiment, a multiple-layer printed circuit board is disclosed. The multiple-layer printed circuit board is formed according to a process that includes selectively applying a dielectric resin to a region of a circuitized core layer and partially curing the dielectric resin. The process also includes forming a layup that includes a layer of pre-impregnated (prepreg) material adjacent to the partially cured dielectric resin of the circuitized core layer. The process further includes performing a lamination cycle to form a multiple-layer printed circuit board.

According to yet another embodiment, a circuitized core layer for multiple-layer printed circuit board manufacturing is disclosed. The circuitized core layer includes a partially cured dielectric resin disposed within a region associated with increased resin demand.

According to another embodiment, a process of manufacturing a multiple-layer printed circuit board is disclosed. The process includes selectively applying a dielectric resin mixture to a region of a circuitized core layer. The dielectric resin mixture includes glass spheres encapsulated within a dielectric resin. The process also includes partially curing the dielectric resin prior to performing a lamination cycle to form a multiple-layer printed circuit board that includes the circuitized core layer.

According to a further embodiment, a multiple-layer printed circuit board is disclosed. The multiple-layer printed circuit board includes a dielectric layer and a circuitized core layer. The dielectric layer is formed from a pre-impregnated (prepreg) material that includes a partially cured dielectric resin encapsulating a woven glass cloth. The circuitized core layer has a surface that is adjacent to the dielectric layer. The surface of the circuitized core layer has a region of dielectric material that includes glass spheres encapsulated within a cured dielectric resin.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

The present disclosure describes selective application of dielectric resin to regions of increased resin demand of circuitized core layers prior to performing a lamination cycle to form a multiple-layer printed circuit board. A dielectric resin may be applied to the regions of increased resin demand using inkjet printing techniques. Subsequently, the resin may be partially cured to form circuitized core layers having partially cured dielectric resin disposed within the regions of increased resin demand. During the lamination cycle, the partially cured dielectric resin fills the regions of increased resin demand with cured resin, thereby preventing resin starvation. In some embodiments of the present disclosure, a dielectric resin mixture that includes glass spheres encapsulated within a dielectric resin may be selectively applied to the regions of increased resin demand. One potential advantage associated with the use of glass spheres is the ability to more accurately match an overall dielectric constant of adjacent dielectric layers.

Figure 1:
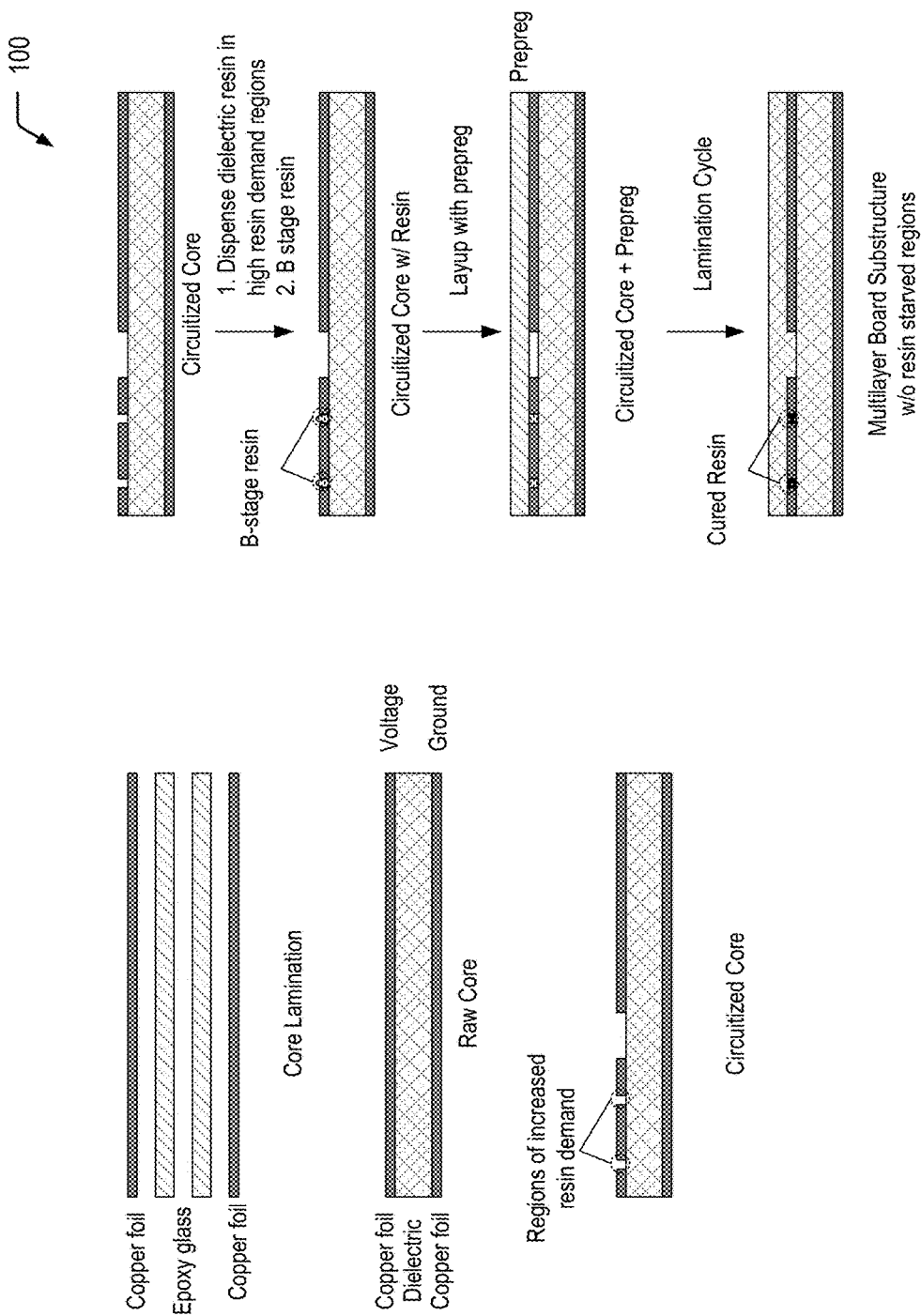
FIG. 1 is a diagram illustrating a process of manufacturing a multiple-layer printed circuit board in which dielectric resin is selectively applied to region(s) of a circuitized core layer associated with increased resin demand, according to one embodiment.

FIG. 1 is a diagram 100 illustrating a process of manufacturing a multiple-layer printed circuit board in which dielectric resin is selectively applied to region(s) of a circuitized core layer associated with increased resin demand, according to one embodiment. In the example of FIG. 1, selective application of resin to regions of a single circuitized core layer is illustrated. As illustrated and further described herein with respect to FIGS. 2, 3A-3D, 4A-4C, 5A-5C, and 6A-6C, multiple circuitized core layers of a particular multiple-layer printed circuit board design may have dielectric resin selectively applied in identified region(s) prior to performing a lamination cycle.

The left side of FIG. 1 depicts a process of forming a circuitized core layer that includes regions of high resin demand. The first stage corresponds to core lamination in which two epoxy glass layers (e.g., two layers of prepreg material) are disposed between two outer layers of copper foil and laminated to form a raw core. In the example of FIG. 1, the outer layers of copper on the raw core correspond to voltage and ground planes in a multiple-layer printed circuit board. The next stage depicted on the left side of FIG. 1 corresponds to patterning of the copper layer of the raw core to form a circuitized core. The circuitized core depicted in FIG. 1 identifies regions of increased resin demand for a multiple-layer printed circuit board formed from the circuitized core.

The right side of FIG. 1 depicts an example according to the present disclosure in which dielectric resin is selectively applied to the regions of increased resin demand and partially cured prior to performing a lamination cycle to form a multiple-layer printed circuit board that includes the circuitized core. The first stage depicted on the right side of FIG. 1 illustrates that dielectric resin ("A-stage" resin) may be selectively applied to the identified regions of the circuitized core and partially cured ("B-staged") to form a circuitized core with resin. As described further herein, in some cases, the A-stage resin may correspond to a dielectric resin mixture that includes glass spheres encapsulated within a dielectric resin. The next stage depicted in FIG. 1 illustrates a selected portion of a layup that includes the circuitized core with resin and a layer of pre-impregnated (prepreg) material adjacent to the B-staged resin to form a circuitized core plus prepreg. The next stage depicted in FIG. 1 illustrates that a lamination cycle results in a multiple-layer printed circuit board in which the selectively applied resin prevents resin starvation in the regions of increased resin demand.

Thus, FIG. 1 illustrates an example of a process of selectively applying dielectric resin to high resin demand regions of a circuitized core layer prior to a lamination cycle in order to prevent resin starvation. As described further herein, the dielectric resin may be selectively applied using an inkjet printing process followed by partial curing ("B-staging") of the resin. In some cases, the regions of increased resin demand may be identified by fabricating a multiple-layer printed circuit board from circuitized core layers without the dielectric resin followed by visual inspection to identify resin starved regions. In other cases, an inverse of the copper pattern may be utilized to identify the regions for resin dispensation via an inkjet printing process. For example, when a distance between adjacent copper traces satisfies a threshold distance associated with increased resin demand, the region between the adjacent copper traces may be identified for resin dispensation.

Figure 2:
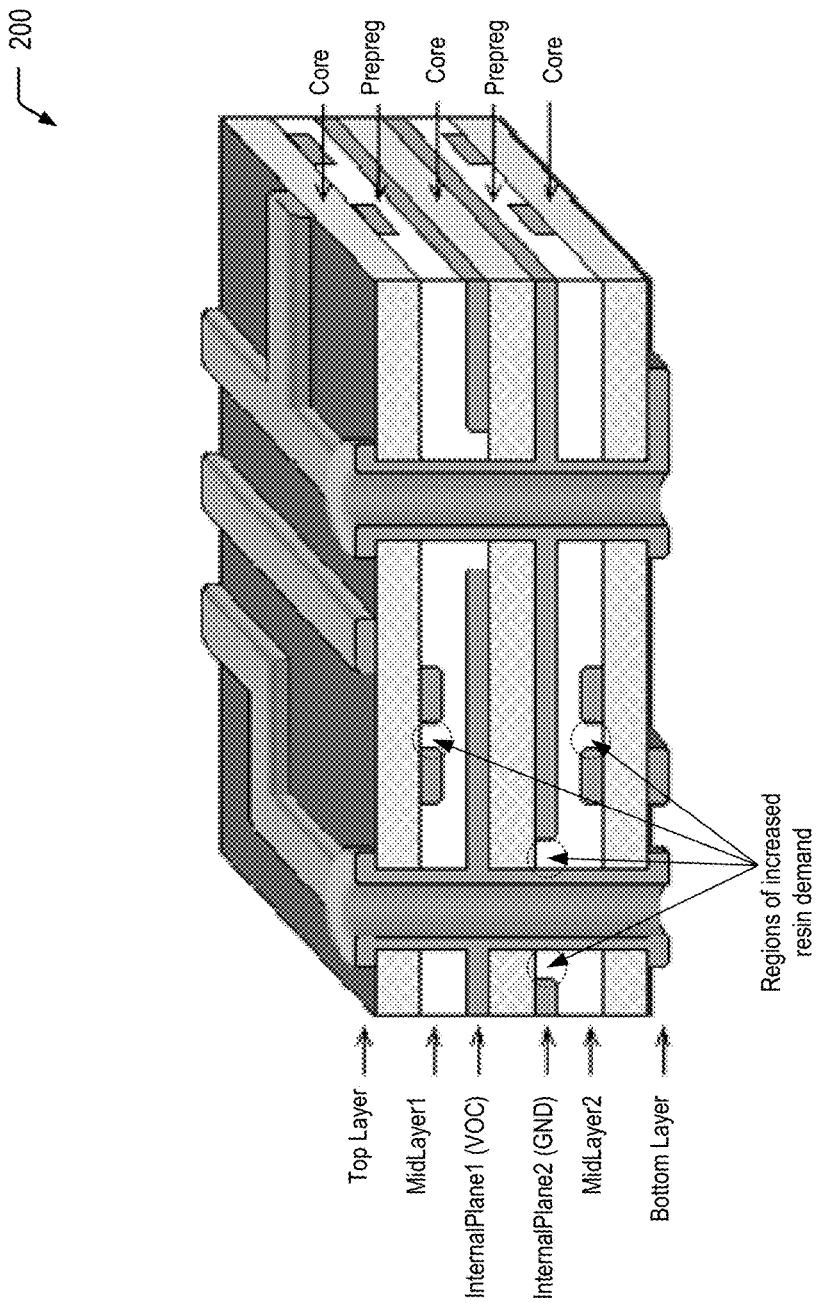
FIG. 2 is a diagram illustrating a portion of a multiple-layer printed circuit board that includes regions of increased resin demand, according to one embodiment.

FIG. 2 is a diagram 200 illustrating a portion of a multiple-layer printed circuit board that includes regions of increased resin demand, according to one embodiment. In the example depicted in FIG. 2, the multiple-layer printed circuit board may be fabricated from a layup that includes three circuitized core layers with two intervening prepreg layers. Examples of circuitized core layers that may be utilized to form the multiple-layer printed circuit board of FIG. 2 are illustrated and further described herein with respect to FIGS. 3A-3D. FIG. 2 further illustrates examples of regions of increased resin demand in each of the circuitized core layers.

FIGS. 3A to 3D illustrate an example of a process of preventing resin starvation in a multiple-layer printed circuit board by selectively applying resin in region(s) of individual circuitized core layers that are identified as increased resin demand region(s). In the example depicted in FIGS. 3A to 3D, three circuitized core layers are utilized to form a multiple-layer printed circuit board. It will be appreciated that the processes described herein may be utilized for multiple-layer printed circuit boards including an alternative number and/or arrangement of circuitized core layers.

Figure 3A:
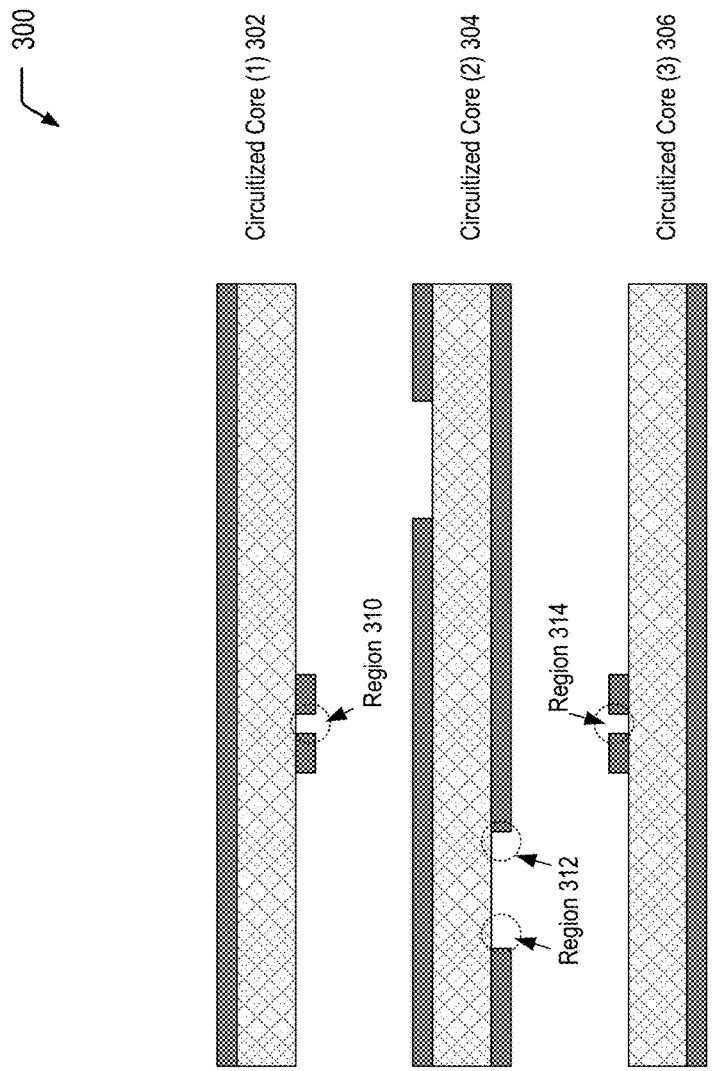
FIG. 3A is a diagram illustrating regions of increased resin demand associated with multiple circuitized core layers to be utilized to form a multiple-layer printed circuit board, according to one embodiment.

Referring to FIG. 3A, a diagram 300 illustrates regions of increased resin demand associated with multiple circuitized core layers to be utilized to form a multiple-layer printed circuit board, according to one embodiment.

In the example of FIG. 3A, the multiple circuitized core layers include a first circuitized core 302, a second circuitized core 304, and a third circuitized core 306. FIG. 3A illustrates that the first circuitized core 302 includes a region 310 of increased resin demand, the second circuitized core 304 includes a region 312 of increased resin demand, and the third circuitized core 306 includes a region 314 of increased resin demand. In some cases, the regions 310-314 of increased resin demand may be identified by fabricating a multiple-layer printed circuit board from a layup that includes the three circuitized core layers 302-306 without the dielectric resin followed by visual inspection to identify resin starved regions. In other cases, an inverse of the copper pattern for each of the circuitized core layers 302-306 may be utilized to identify the regions for resin dispensation via an inkjet printing process.

Figure 3B:
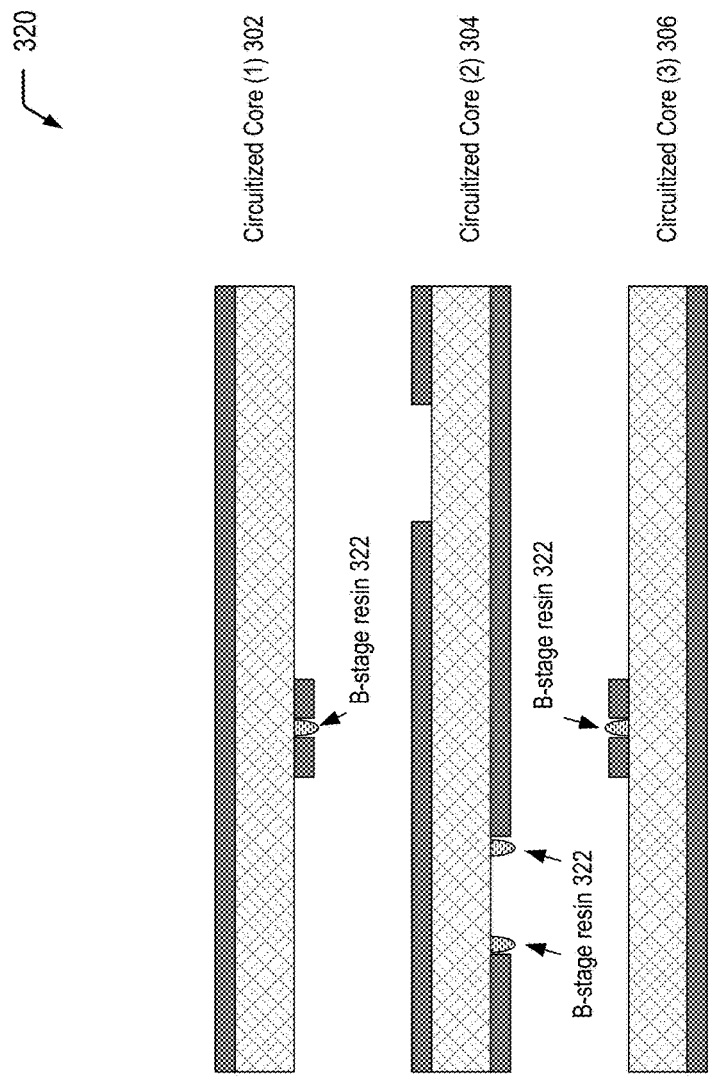
FIG. 3B is a diagram illustrating selective application of a dielectric resin to the regions of the circuitized core layers depicted in FIG. 3A and partial curing of the dielectric resin, according to one embodiment.

Referring to FIG. 3B, a diagram 320 illustrates selective application of a dielectric resin to the regions of the circuitized core layers depicted in FIG. 3A and partial curing of the dielectric resin, according to one embodiment. FIG. 3B illustrates that, following selective application and partial curing, the first circuitized core 302 includes B-stage resin 322 in the region 310, the second circuitized core 304 includes B-stage resin 322 in the region 312, and the third circuitized core 306 includes B-stage resin 322 in the region 314. In some cases, the B-stage resin 322 may correspond to a dielectric resin mixture that includes glass spheres encapsulated within a partially cured dielectric resin.

Figure 4A:
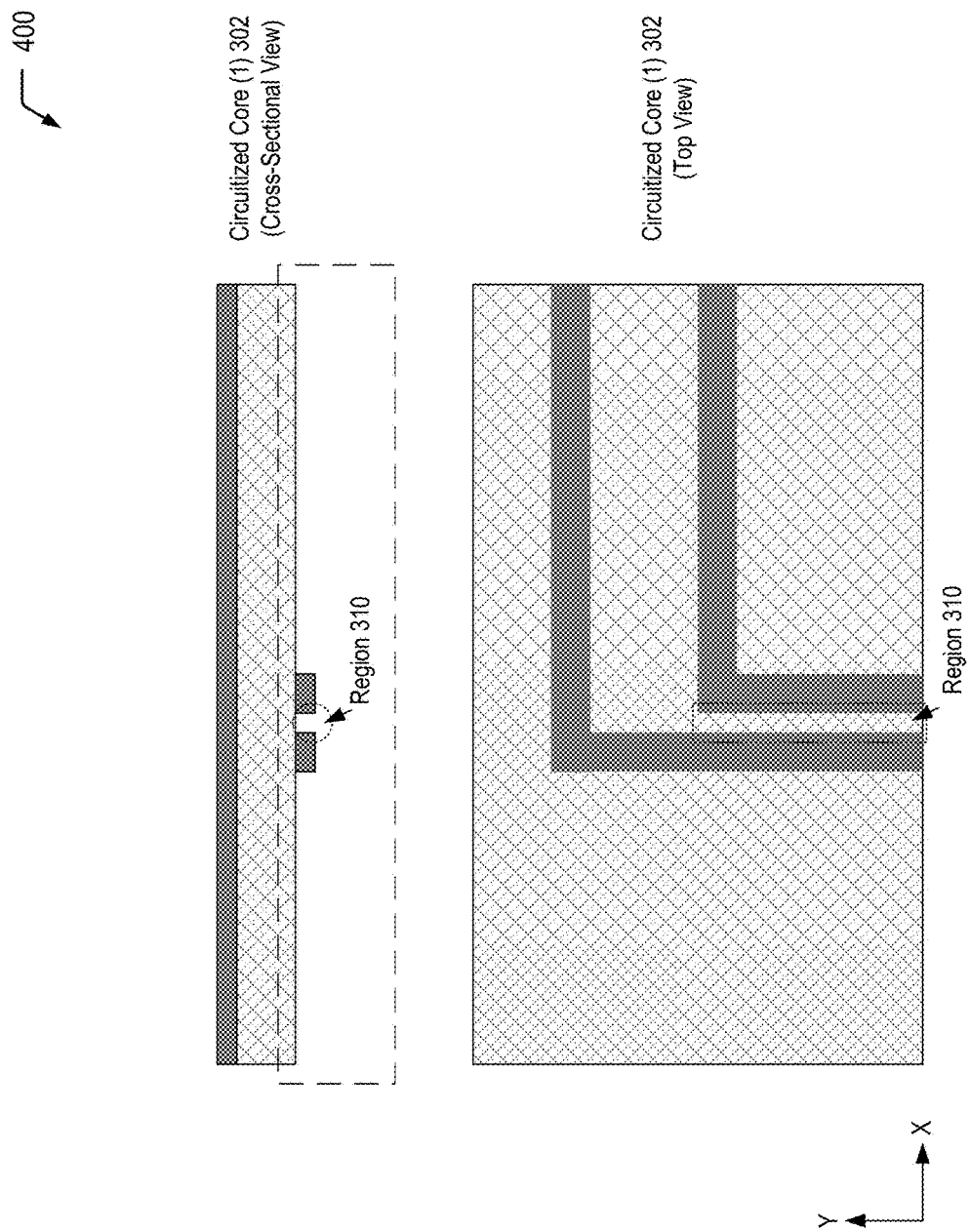
FIGS. 4A-4C are diagrams illustrating stages of a process of forming the first circuitized core layer depicted in FIGS. 3B and 3C by selectively applying a dielectric resin to region(s) of increased resin demand followed by partial curing of the dielectric resin prior to performing a lamination cycle, according to one embodiment.
Figure 4B:
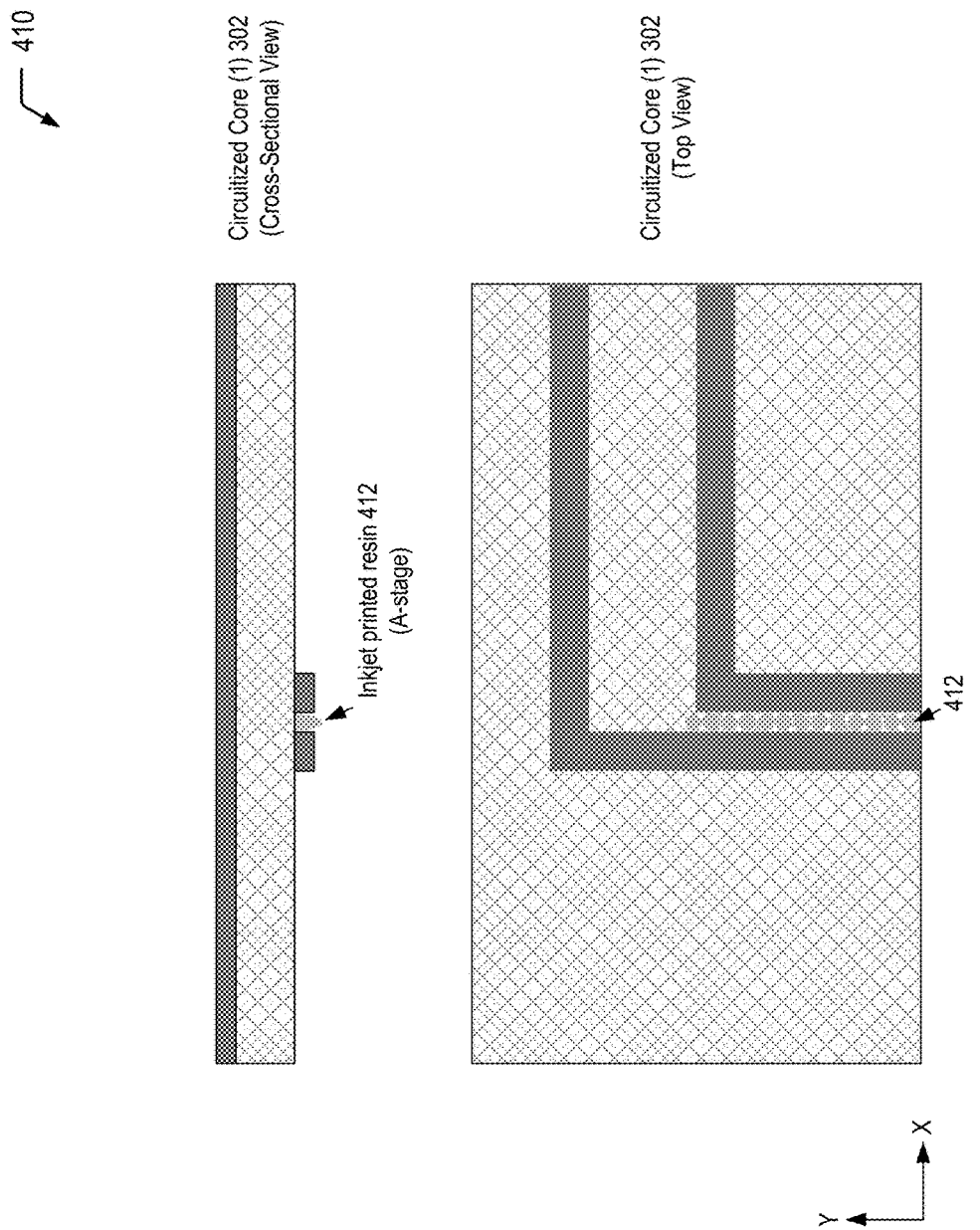
Figure 4C:
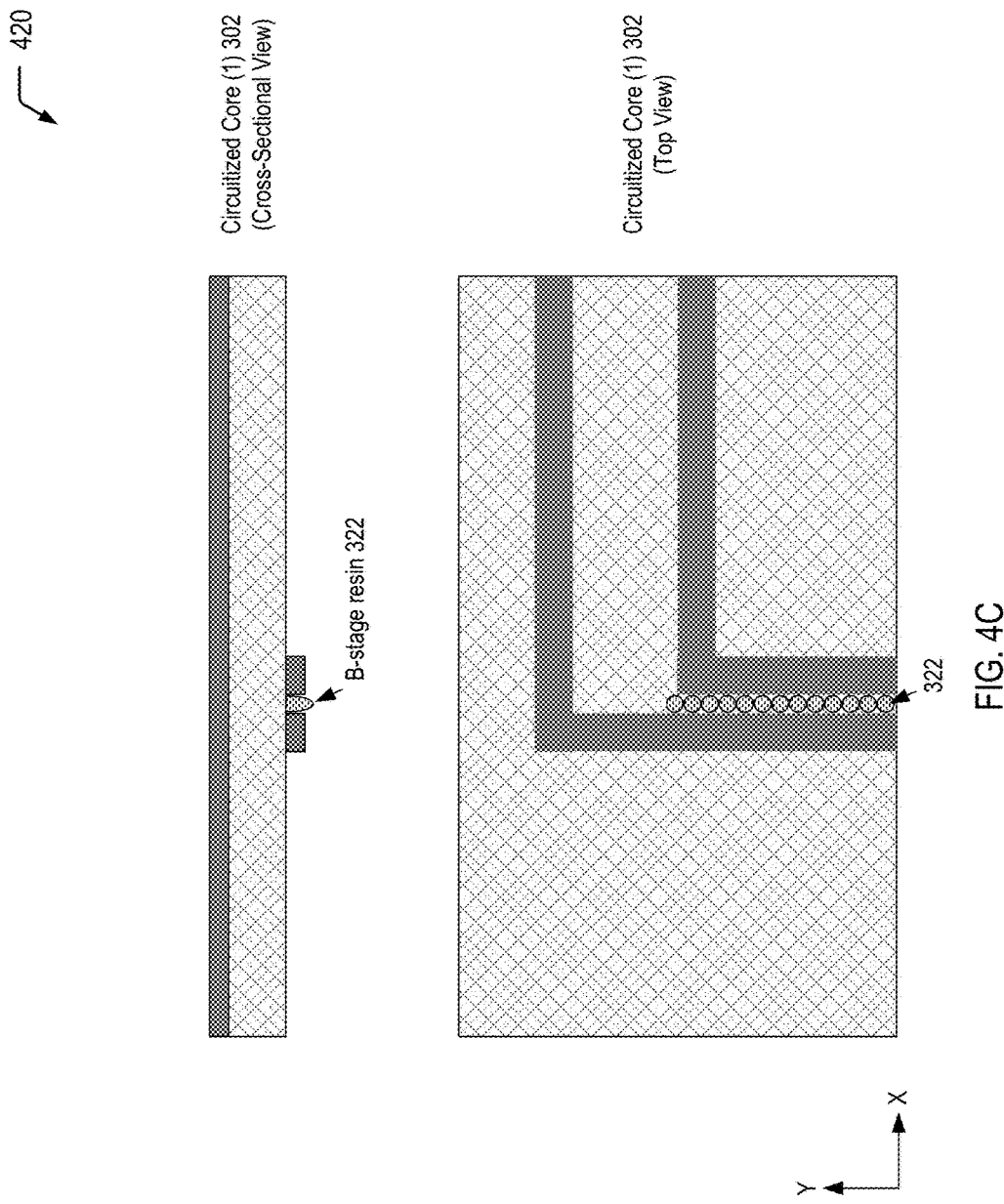

The process of selectively applying dielectric resin onto the first circuitized core 302 and partially curing the dielectric resin to form the B-stage resin 322 is illustrated and further described herein with respect to FIGS. 4A-4C. The process of selectively applying dielectric resin onto the second circuitized core 304 and partially curing the dielectric resin to form the B-stage resin 322 is illustrated and further described herein with respect to FIGS. 5A-5C. The process of selectively applying dielectric resin onto the third circuitized core 306 and partially curing the dielectric resin to form the B-stage resin 322 is illustrated and further described herein with respect to FIGS. 6A-6C.

Figure 3C:
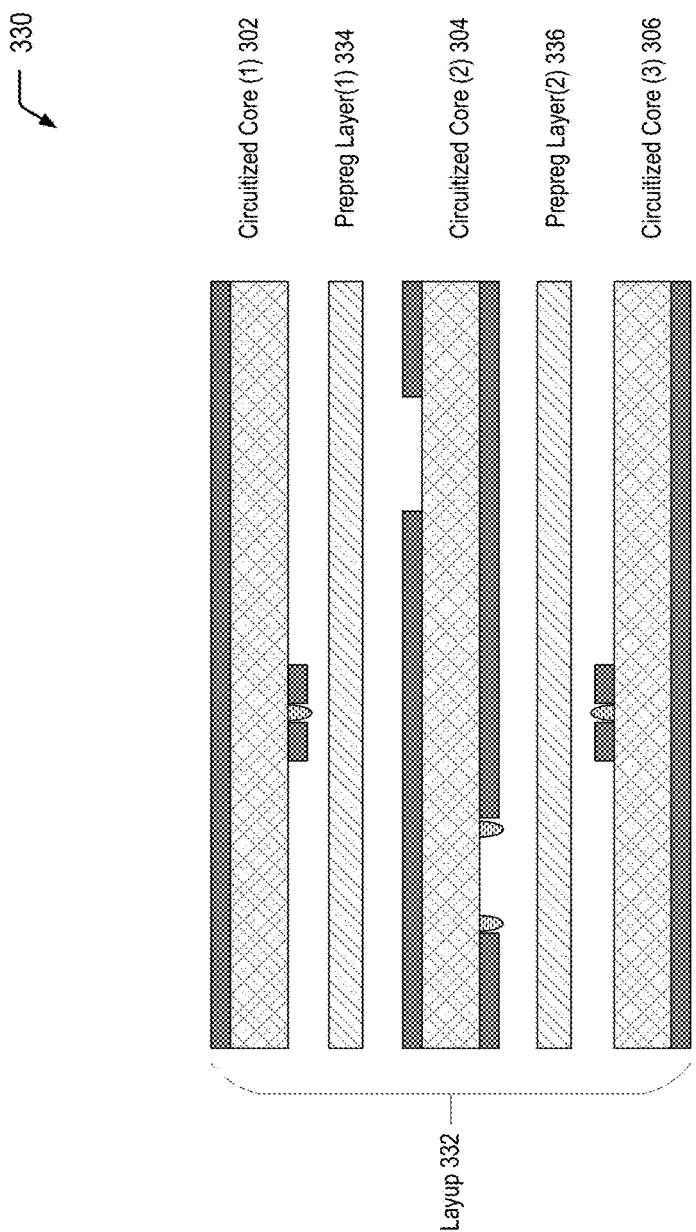
FIG. 3C is a diagram illustrating a layup that includes the circuitized core layers with the partially cured dielectric resin of FIG. 3B prior to a lamination cycle, according to one embodiment.

Referring FIG. 3C, a diagram 330 illustrates a layup 332 that includes the circuitized core layers 302-306 with the partially cured dielectric resin of FIG. 3B prior to a lamination cycle, according to one embodiment.

FIG. 3C illustrates that the layup 332 includes a first prepreg layer 334 disposed between a bottom surface of the first circuitized core layer 302 that includes the B-stage resin 322 and a top surface of the second circuitized core layer 304 (that does not include the B-stage resin 322). The layup 332 further includes a second prepreg layer 336 disposed between a bottom surface of the second circuitized core layer 304 (that includes the B-stage resin 322) and a top surface of the third circuitized core layer 306 (that includes the B-stage resin 322).

Figure 3D:
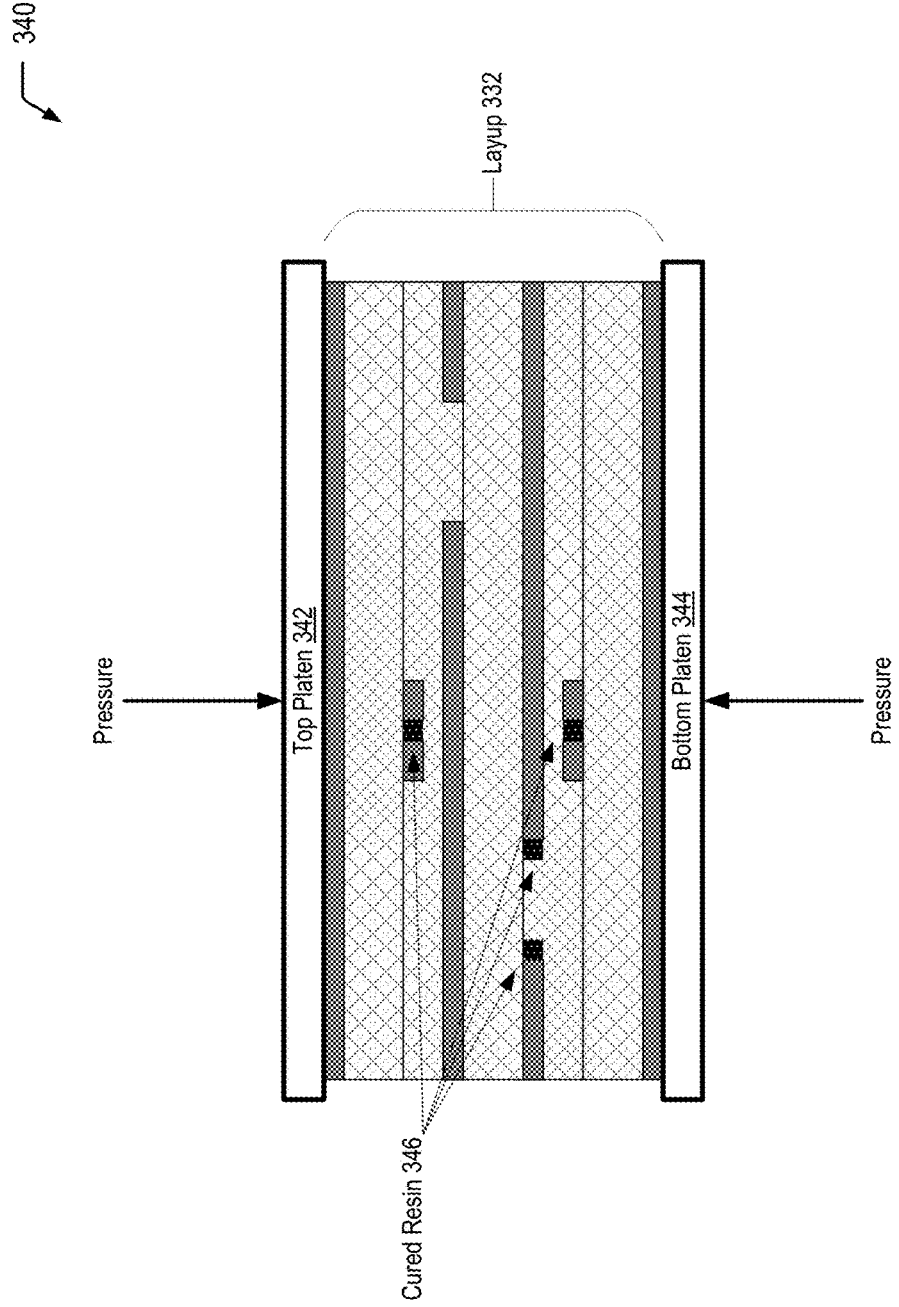
FIG. 3D is a diagram illustrating that lamination of the layup of FIG. 3C to form a multiple-layer printed circuit board results in curing of the dielectric resin within the regions of increased resin demand, according to one embodiment.

Referring FIG. 3D, a diagram 340 illustrates that lamination of the layup 332 of FIG. 3C to form a multiple-layer printed circuit board results in curing of the B-stage resin 322, according to one embodiment. The lamination cycle depicted in FIG. 3D includes disposing the layup 332 between a top platen 342 and a bottom platen 344, and applying pressure and heat. The lamination cycle results in curing of the B-stage resin 322 to form cured resin 346 in each of the regions 310-314 of increased resin demand, thereby preventing resin starvation in the multiple-layer printed circuit board. In some cases, the cured resin 346 may correspond to a dielectric resin mixture that includes glass spheres encapsulated within a cured dielectric resin.

FIGS. 4A-4C are diagrams illustrating stages of a process of forming the first circuitized core layer depicted in FIGS. 3B and 3C by selectively applying a dielectric resin to region(s) of increased resin demand followed by partial curing of the dielectric resin prior to performing a lamination cycle, according to one embodiment.

Referring to FIG. 4A, a diagram 400 illustrates a cross-sectional view and a top view of the surface of the first circuitized core 302 of FIG. 3A. FIG. 4A illustrates that the region 310 of increased resin demand may correspond to a relatively narrow gap between two copper traces on the first circuitized core 302. The top view illustrates that the region 310 may be identified by coordinates along an X-axis and a Y-axis. As illustrated and further described herein with respect to FIG. 4B, the coordinates along the X-axis and the Y-axis may be utilized by an inkjet printer for resin dispensation.

Referring to FIG. 4B, a diagram 410 illustrates a cross-sectional view and a top view of the surface of the first circuitized core 302 of FIG. 4A after resin dispensation into the region 310 of increased resin demand. In the embodiment depicted in FIG. 4B, the coordinates of the region 310 along the X-axis and the Y-axis may be utilized to dispense a pattern of individual "droplets" of resin 412 (identified as "Inkjet printed resin" in FIG. 4B) in a manner similar to dispensation of ink by an inkjet printer. The resin 412 dispensed within the region 310 represents an "A-stage" resin. In some cases, the resin 412 depicted in FIG. 4B may correspond to a dielectric resin mixture that includes glass spheres (e.g., hollow glass spheres) encapsulated within a dielectric resin. For example, the glass spheres may correspond to hollow glass spheres formed from a glass material (e.g., an "E-glass" material) that is substantially similar to a woven glass cloth of the adjacent prepreg layer 334 in the layup 332 (depicted in in FIG. 3C). Referring to the multiple-layer printed circuit board depicted in FIG. 3D, the cured resin 346 within the region 310 of the first circuitized core 302 may have an overall dielectric constant that is substantially similar to an overall dielectric constant of the adjacent dielectric layer formed from the first prepreg layer 334.

FIG. 4C is a diagram 420 illustrating that the "A-stage" resin 412 dispensed within the region 310, as shown in FIG. 4B, is then partially cured ("B-staged") to form the B-stage resin 322. In some cases, the B-stage resin 322 depicted in FIG. 4C may correspond to a dielectric resin mixture that includes glass spheres (e.g., hollow glass spheres) encapsulated within a partially cured dielectric resin.

In some cases, the resin 412 dispensed within the region 310 may be selected based on the resin associated within an adjacent prepreg layer during a subsequent lamination cycle to form a multiple-layer printed circuit board. For example, referring to the layup 332 depicted in FIG. 3C, the resin 412 dispensed within the region 310 may be selected based on the resin associated with the first prepreg layer 334 adjacent to the first circuitized core layer 302. To illustrate, the "A-stage" resin 412 may be selected such that, after "B-staging", the B-stage resin 322 corresponds to the B-staged resin within the first prepreg layer 334.

In other cases, the resin 412 dispensed within the region 310 may be selected such that, after the lamination cycle depicted in FIG. 3D, the cured resin 346 has a dielectric constant that is substantially similar to a dielectric constant of the adjacent dielectric layer formed from the first prepreg layer 334. That is, the resin 412 selected for dispensation within the region 310 may be different from the resin associated with the first prepreg layer 334 in order to match an overall dielectric constant of the woven glass cloth and cured resin after the lamination cycle.

Figure 5A:
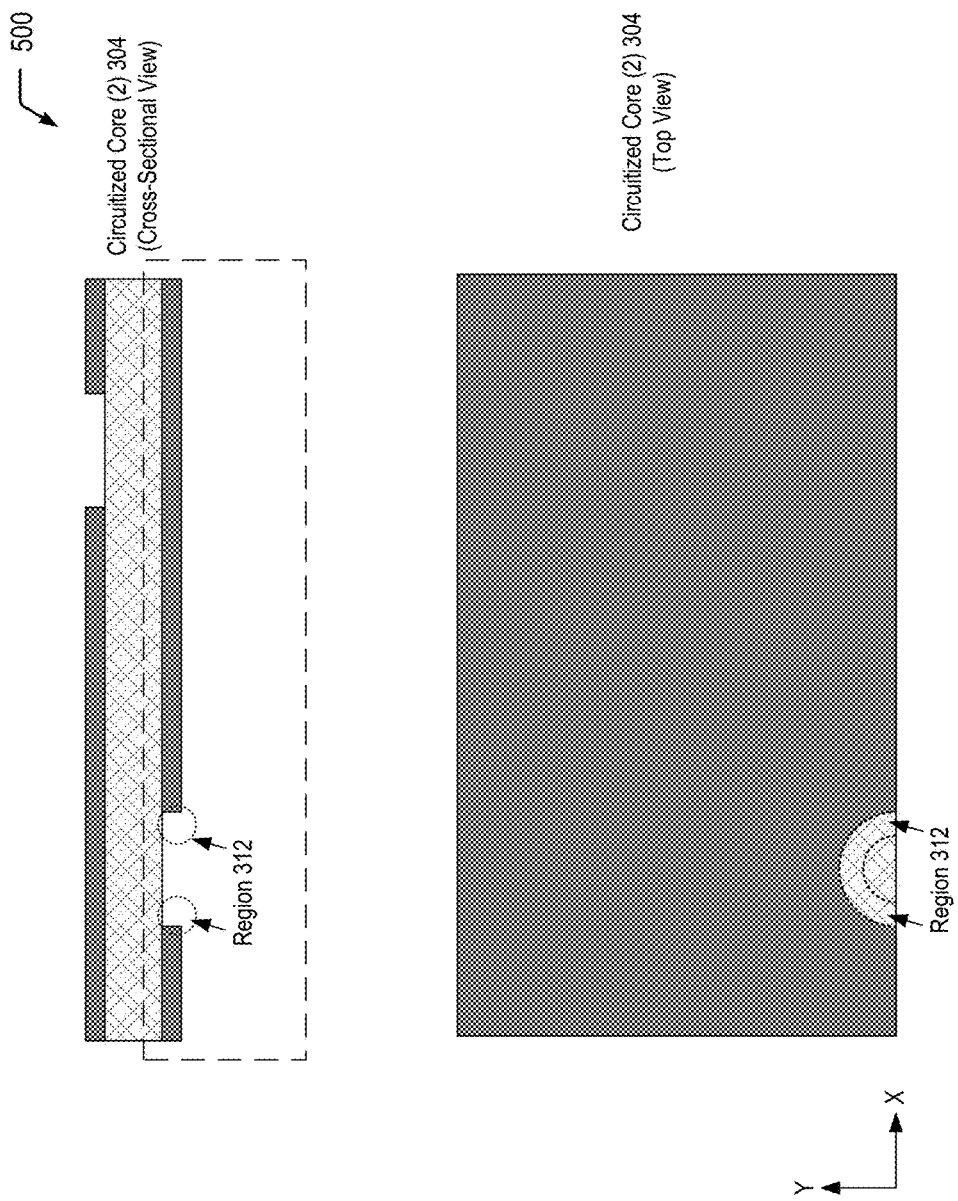
FIGS. 5A-5C are diagrams illustrating stages of a process of forming the second circuitized core layer depicted in FIGS. 3B and 3C by selectively applying a dielectric resin to region(s) of increased resin demand followed by partial curing of the dielectric resin prior to performing a lamination cycle, according to one embodiment.
Figure 5B:
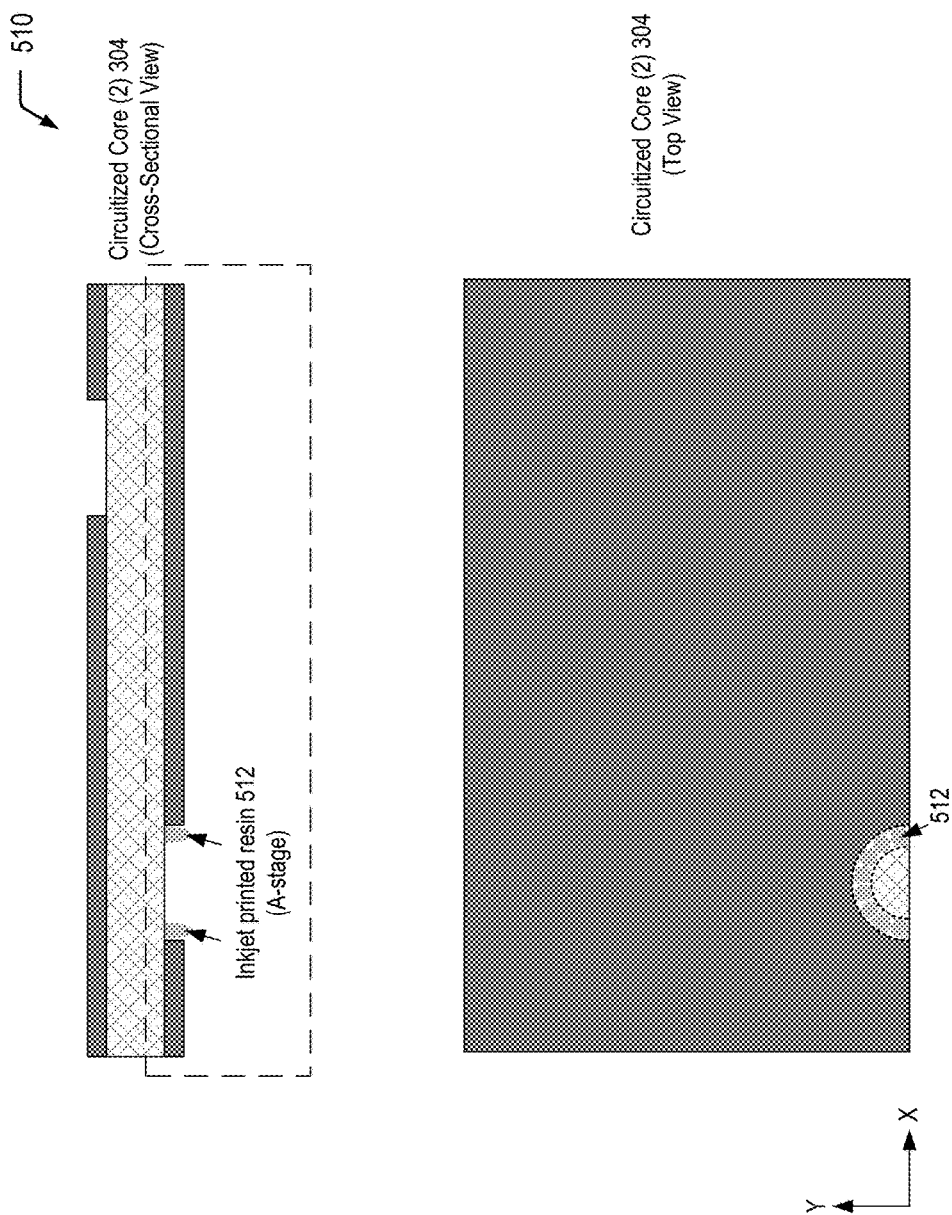
Figure 5C:
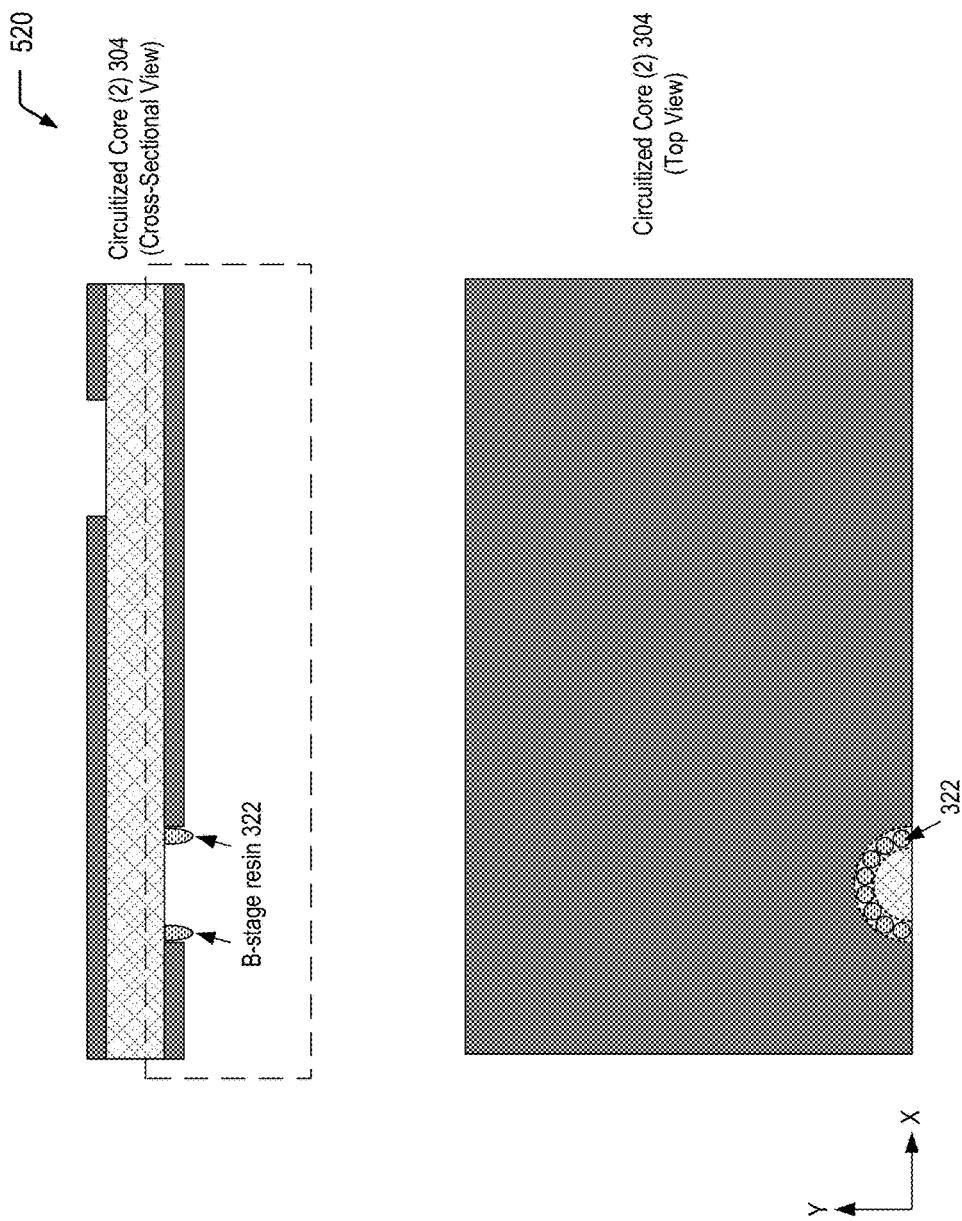

FIGS. 5A-5C are diagrams illustrating stages of a process of forming the second circuitized core layer depicted in FIGS. 3B and 3C by selectively applying a dielectric resin to region(s) of increased resin demand followed by partial curing of the dielectric resin prior to performing a lamination cycle, according to one embodiment.

Referring to FIG. 5A, a diagram 500 illustrates a cross-sectional view and a top view of the surface of the second circuitized core 304 of FIG. 3A. FIG. 5A illustrates that the region 312 of increased resin demand may correspond to a relatively narrow area between a plated through hole (PTH) and copper of the ground plane (as depicted in FIG. 2). The top view illustrates that the region 312 may be identified by coordinates along an X-axis and a Y-axis. As illustrated and further described herein with respect to FIG. 5B, the coordinates along the X-axis and the Y-axis may be utilized by an inkjet printer for resin dispensation.

Referring to FIG. 5B, a diagram 510 illustrates a cross-sectional view and a top view of the surface of the second circuitized core 304 of FIG. 5A after resin dispensation into the region 312 of increased resin demand. In the embodiment depicted in FIG. 5B, the coordinates of the region 312 along the X-axis and the Y-axis may be utilized to dispense a pattern of individual "droplets" of resin 512 (identified as "Inkjet printed resin" in FIG. 5B) in a manner similar to dispensation of ink by an inkjet printer. The resin 512 dispensed within the region 312 represents an "A-stage" resin. In some cases, the resin 512 depicted in FIG. 5B may correspond to a dielectric resin mixture that includes glass spheres (e.g., hollow glass spheres) encapsulated within a dielectric resin. For example, the glass spheres may correspond to hollow glass spheres formed from a glass material (e.g., an "E-glass" material) that is substantially similar to a woven glass cloth of the adjacent prepreg layer 336 in the layup 332 (depicted in in FIG. 3C). Referring to the multiple-layer printed circuit board depicted in FIG. 3D, the cured resin 346 within the region 312 of the second circuitized core 304 may have an overall dielectric constant that is substantially similar to an overall dielectric constant of the adjacent dielectric layer formed from the second prepreg layer 336.

FIG. 5C is a diagram 520 illustrating that the "A-stage" resin 512 dispensed within the region 312, as shown in FIG. 5B, is then partially cured ("B-staged") to form the B-stage resin 322. In some cases, the B-stage resin 322 depicted in FIG. 5C may correspond to a dielectric resin mixture that includes glass spheres (e.g., hollow glass spheres) encapsulated within a partially cured dielectric resin.

In some cases, the resin 512 dispensed within the region 312 may be selected based on the resin associated within an adjacent prepreg layer during a subsequent lamination cycle to form a multiple-layer printed circuit board. For example, referring to the layup 332 depicted in FIG. 3C, the resin 512 dispensed within the region 312 may be selected based on the resin associated with the second prepreg layer 336 adjacent to the second circuitized core 304. To illustrate, the "A-stage" resin 512 may be selected such that, after "B-staging", the B-stage resin 322 corresponds to the B-staged resin within the second prepreg layer 336.

In other cases, the resin 512 dispensed within the region 312 may be selected such that, after the lamination cycle depicted in FIG. 3D, the cured resin 346 has a dielectric constant that is substantially similar to a dielectric constant of the adjacent dielectric layer formed from the second prepreg layer 336. That is, the resin 512 selected for dispensation within the region 312 may be different from the resin associated with the second prepreg layer 336 in order to match an overall dielectric constant of the woven glass cloth and cured resin after the lamination cycle.

Figure 6A:
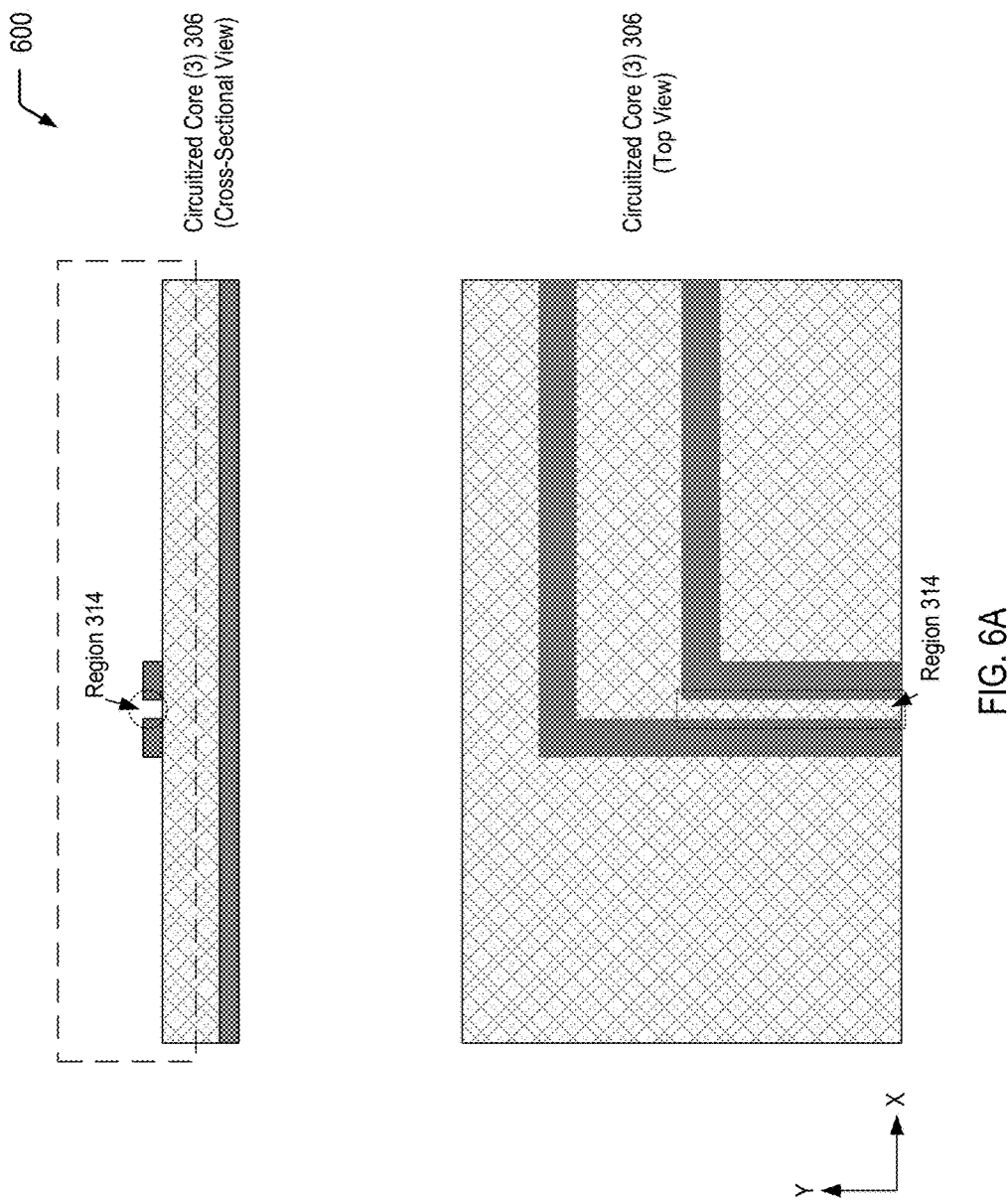
FIGS. 6A-6C are diagrams illustrating stages of a process of forming the third circuitized core layer depicted in FIGS. 3B and 3C by selectively applying a dielectric resin to region(s) of increased resin demand followed by partial curing of the dielectric resin prior to performing a lamination cycle, according to one embodiment.
Figure 6B:
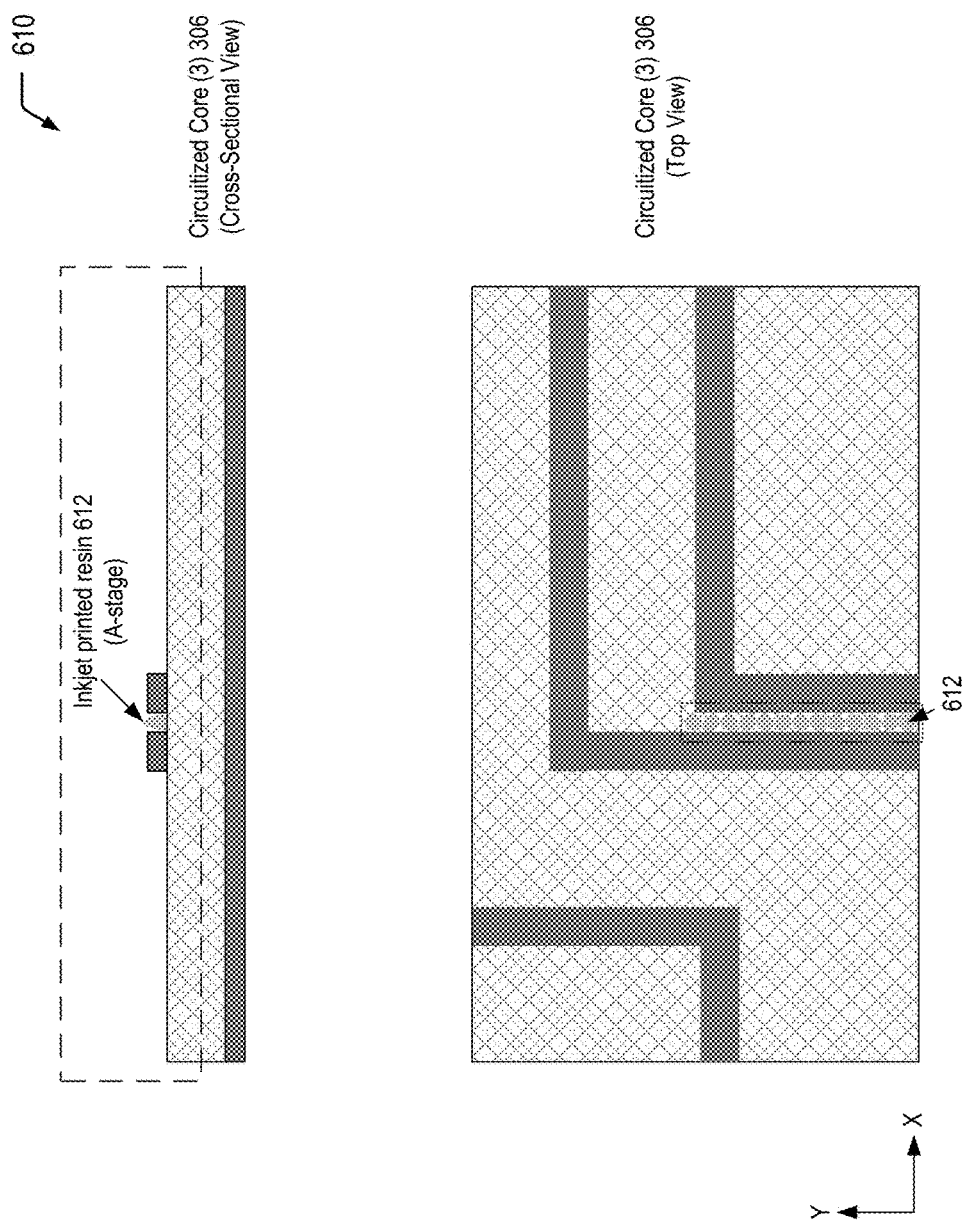
Figure 6C:
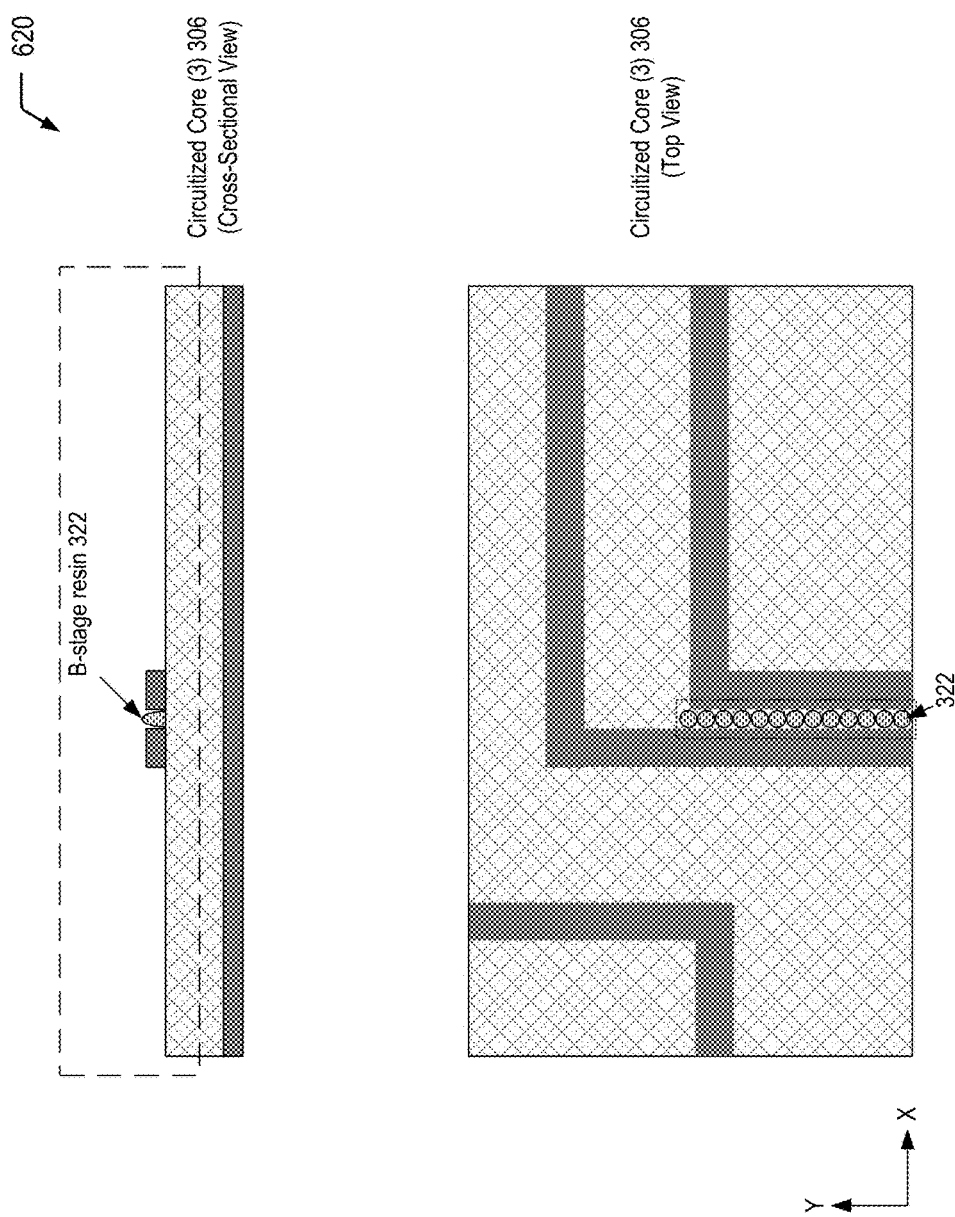

FIGS. 6A-6C are diagrams illustrating stages of a process of forming the third circuitized core layer depicted in FIGS. 3B and 3C by selectively applying a dielectric resin to region(s) of increased resin demand followed by partial curing of the dielectric resin prior to performing a lamination cycle, according to one embodiment.

Referring to FIG. 6A, a diagram 600 illustrates a cross-sectional view and a top view of the surface of the third circuitized core 306 of FIG. 3A. FIG. 6A illustrates that the region 314 of increased resin demand may correspond to a relatively narrow gap between two copper traces on the third circuitized core 306. The top view illustrates that the region 314 may be identified by coordinates along an X-axis and a Y-axis. As illustrated and further described herein with respect to FIG. 6B, the coordinates along the X-axis and the Y-axis may be utilized by an inkjet printer for resin dispensation.

Referring to FIG. 6B, a diagram 610 illustrates a cross-sectional view and a top view of the surface of the third circuitized core 306 of FIG. 6A after resin dispensation into the region 314 of increased resin demand. In the embodiment depicted in FIG. 6B, the coordinates of the region 314 along the X-axis and the Y-axis may be utilized to dispense a pattern of individual "droplets" of resin 612 (identified as "Inkjet printed resin" in FIG. 6B) in a manner similar to dispensation of ink by an inkjet printer. The resin 612 dispensed within the region 314 represents an "A-stage" resin. In some cases, the resin 612 depicted in FIG. 6B may correspond to a dielectric resin mixture that includes glass spheres (e.g., hollow glass spheres) encapsulated within a dielectric resin. For example, the glass spheres may correspond to hollow glass spheres formed from a glass material (e.g., an "E-glass" material) that is substantially similar to a woven glass cloth of the adjacent prepreg layer 336 in the layup 332 (depicted in in FIG. 3C). Referring to the multiple-layer printed circuit board depicted in FIG. 3D, the cured resin 346 within the region 314 of the third circuitized core 306 may have an overall dielectric constant that is substantially similar to an overall dielectric constant of the adjacent dielectric layer formed from the second prepreg layer 336.

FIG. 6C is a diagram 620 illustrating that the "A-stage" resin 612 dispensed within the region 314, as shown in FIG. 6B, is then partially cured ("B-staged") to form the B-stage resin 322. In some cases, the B-stage resin 322 depicted in FIG. 6C may correspond to a dielectric resin mixture that includes glass spheres (e.g., hollow glass spheres) encapsulated within a partially cured dielectric resin.

In some cases, the resin 612 dispensed within the region 314 may be selected based on the resin associated within an adjacent prepreg layer during a subsequent lamination cycle to form a multiple-layer printed circuit board. For example, referring to the layup 332 depicted in FIG. 3C, the resin 612 dispensed within the region 314 may be selected based on the resin associated with the second prepreg layer 336 adjacent to the third circuitized core 306. To illustrate, the "A-stage" resin 612 may be selected such that, after "B-staging", the B-stage resin 322 corresponds to the B-staged resin within the second prepreg layer 336.

In other cases, the resin 612 dispensed within the region 314 may be selected such that, after the lamination cycle depicted in FIG. 3D, the cured resin 346 has a dielectric constant that is substantially similar to a dielectric constant of the adjacent dielectric layer formed from the second prepreg layer 336. That is, the resin 612 selected for dispensation within the region 314 may be different from the resin associated with the second prepreg layer 336 in order to match an overall dielectric constant of the woven glass cloth and cured resin after the lamination cycle.

Figure 7:
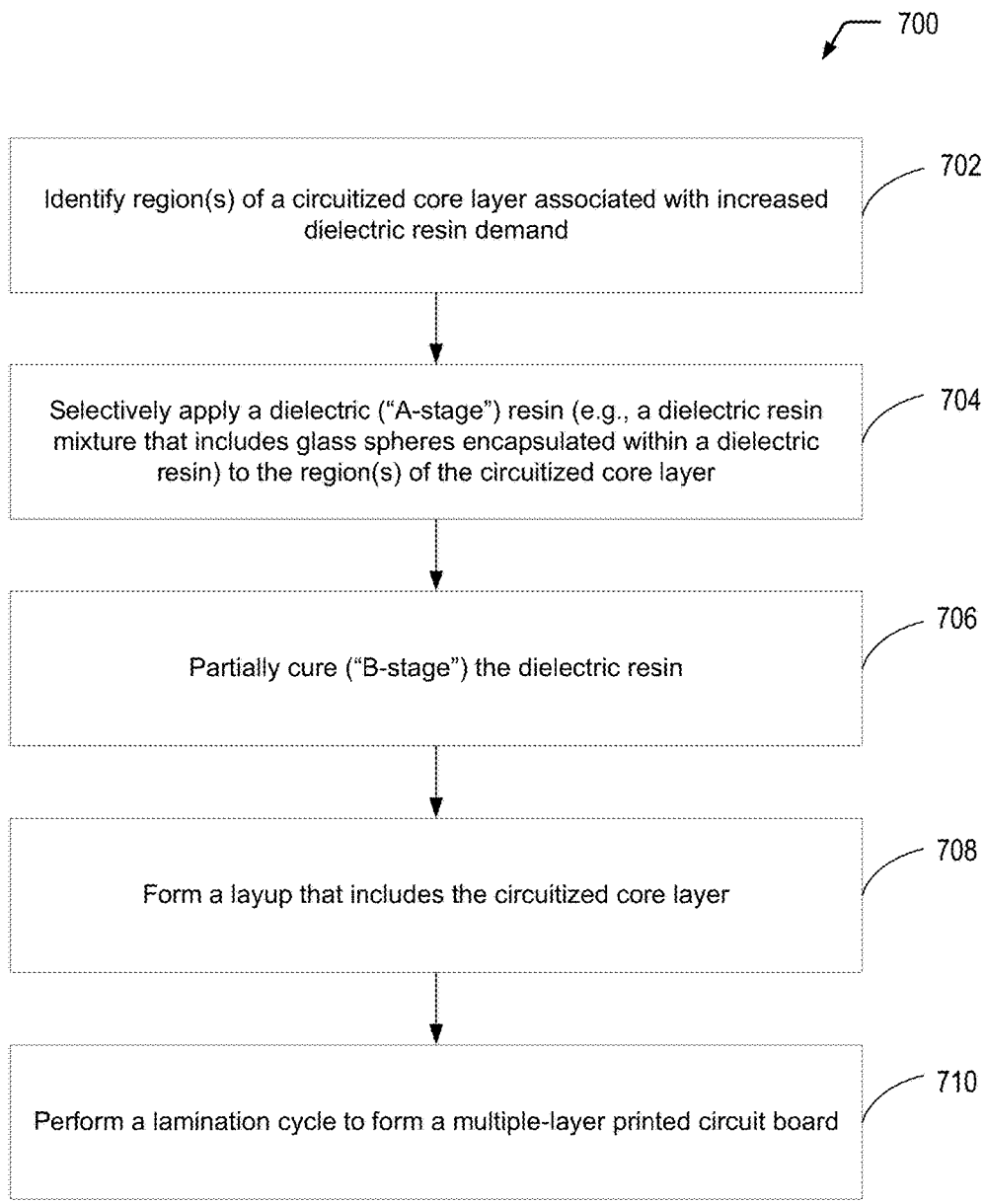
FIG. 7 is a flow diagram illustrating a particular embodiment of a process of manufacturing a multiple-layer printed circuit board that includes selectively applying and partially curing a dielectric resin in increased resin demand region(s) of circuitized core layer(s) prior to a lamination cycle.

FIG. 7 is a flow diagram illustrating a particular embodiment of a process 700 of manufacturing a multiple-layer printed circuit board that includes selectively applying and partially curing a dielectric resin in increased resin demand region(s) of circuitized core layer(s) prior to a lamination cycle. In some cases, the dielectric resin may correspond to a dielectric resin mixture that includes glass spheres encapsulated within a dielectric resin. In a particular embodiment, the glass spheres may correspond to hollow glass spheres formed from a glass material (e.g., an "E-glass" material) that is substantially similar to a woven glass cloth material of a pre-impregnated material to be utilized to form dielectric layers in a multiple-layer printed circuit board. This may enable the region of the circuitized core layer including the glass spheres and cured dielectric resin to have a dielectric constant that is substantially similar to a dielectric constant associated with an adjacent dielectric layer formed from the prepreg material.

In some embodiments, the process 700 depicted in FIG. 7 may be utilized to form a multiple-layer printed circuit board that includes a dielectric layer and a circuitized core layer. The dielectric layer is formed from a prepreg material that includes a partially cured dielectric resin encapsulating a woven glass cloth. The circuitized core layer has a surface that is adjacent to the dielectric layer. The surface of the circuitized core layer has a region of dielectric material that includes glass spheres encapsulated within a cured dielectric resin.

The process 700 includes identifying one or more regions of a circuitized core layer associated with increased dielectric resin demand, at 702. For example, referring to FIGS. 3A and 4A, the region 310 of the first circuitized core 302 is associated with increased dielectric resin demand. As another example, referring to FIGS. 3A and 5A, the region 312 of the second circuitized core 304 is associated with increased dielectric resin demand. As a further example, referring to FIGS. 3A and 6A, the region 314 of the third circuitized core 306 is associated with increased dielectric resin demand.

The process 700 includes selectively applying a dielectric resin to the region(s) of the circuitized core layer, at 704. For example, referring to FIG. 4B, the resin 412 may be inkjet printed into the region 310 of the first circuitized core 302 (e.g., based on X-Y coordinates of the region 310, as depicted in the top view). As another example, referring to FIG. 5B, the resin 512 may be inkjet printed into the region 312 of the second circuitized core 304 (e.g., based on X-Y coordinates of the region 312, as depicted in the top view). As a further example, referring to FIG. 6B, the resin 612 may be inkjet printed into the region 314 of the third circuitized core 306 (e.g., based on X-Y coordinates of the region 314, as depicted in the top view). In some cases, the dielectric resin may correspond to a dielectric resin mixture that includes glass spheres encapsulated within a dielectric resin.

The process 700 includes partially curing the dielectric resin, at 706. For example, referring to FIG. 4C, partially curing the resin 412 dispensed within the region 310 forms the B-stage resin 322 within the region 310 of the first circuitized core 302. As another example, referring to FIG. 5C, partially curing the resin 512 dispensed within the region 312 forms the B-stage resin 322 within the region 312 of the second circuitized core 304. As a further example, referring to FIG. 6C, partially curing the resin 612 dispensed within the region 314 forms the B-stage resin 322 within the region 314 of the third circuitized core 306. In some embodiments, the B-stage resin 322 depicted in FIGS. 4C, 5C, and 6C may correspond to a dielectric resin mixture that includes glass spheres encapsulated within a partially cured dielectric resin.

The process 700 includes forming a layup that includes the circuitized core layer, at 708. For example, referring to FIG. 3C, the layup 332 includes the first circuitized core 302 with the B-stage resin 322 within the region 310 of increased resin demand. The region 310 of the first circuitized core 302 is adjacent to the first prepreg layer 334 in the layup 332. As another example, referring to FIG. 3C, the layup 332 includes the second circuitized core 304 with the B-stage resin 322 within the region 312 of increased resin demand. The region 312 of the second circuitized core 304 is adjacent to the second prepreg layer 336 in the layup 332. As a further example, referring to FIG. 3C, the layup 332 includes the third circuitized core 306 with the B-stage resin 322 within the region 314 of increased resin demand. The region 314 of the third circuitized core 306 is adjacent to the second prepreg layer 336 in the layup 332.

The process 700 includes performing a lamination cycle to form a multiple-layer printed circuit board, at 710. For example, referring to FIG. 3D, the layup 332 of FIG. 3C may be disposed between the top platen 342 and the bottom platen 344, and the lamination cycle may include applying pressure and heat. The resulting multiple-layer printed circuit board includes the cured resin 346 in the regions 310-314 of increased resin demand, thereby preventing resin starvation. In some cases, the cured resin 346 may correspond to a dielectric resin mixture that includes glass spheres encapsulated within a cured dielectric resin. This may enable the region of the circuitized core layer that includes the cured resin 346 to have a first dielectric constant that is substantially similar to a second dielectric constant associated with an adjacent dielectric layer formed from the prepreg material.

Thus, FIG. 7 illustrates an example of a process of manufacturing a multiple-layer printed circuit board that includes selectively applying and partially curing a dielectric resin in increased resin demand region(s) of circuitized core layer(s) prior to a lamination cycle. The additional dielectric resin may fill the regions of increased resin demand during the lamination cycle, thereby preventing resin starvation.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A multiple-layer printed circuit board comprising:
   a dielectric layer formed from a pre-impregnated (prepreg) material that includes a partially cured dielectric resin encapsulating a woven glass cloth; and
   a circuitized core layer having a surface that is adjacent to the dielectric layer, the surface of the circuitized core layer having a high resin demand region of dielectric material with glass spheres encapsulated within a cured dielectric resin and another region of dielectric material without the glass spheres.

2. The multiple-layer printed circuit board of claim 1, wherein the high resin demand region of dielectric material has a first dielectric constant that is substantially similar to a second dielectric constant associated with the dielectric layer that is adjacent to the surface of the circuitized core layer.

* * * * *